United States Patent
Kimura

(10) Patent No.: US 7,652,466 B2
(45) Date of Patent: Jan. 26, 2010

(54) BUFFER CIRCUIT, AMPLIFIER CIRCUIT, AND TEST APPARATUS

(75) Inventor: Hiroki Kimura, Tokyo (JP)

(73) Assignee: Advantest Corporation, Tokyo (JP)

( * ) Notice: Subject to any disclaimer, the term of this patent is extended or adjusted under 35 U.S.C. 154(b) by 267 days.

(21) Appl. No.: 11/829,939

(22) Filed: Jul. 29, 2007

(65) Prior Publication Data
US 2009/0027041 A1    Jan. 29, 2009

(51) Int. Cl.
*G01R 1/30* (2006.01)
*H03B 1/00* (2006.01)

(52) U.S. Cl. .................. 324/123 R; 327/108
(58) Field of Classification Search ........ None
See application file for complete search history.

(56) References Cited

U.S. PATENT DOCUMENTS

| | | | | |
|---|---|---|---|---|
| 4,937,480 A | * | 6/1990 | Higuchi et al. | 327/433 |
| 5,955,908 A | | 9/1999 | Tam | |
| 6,232,805 B1 | * | 5/2001 | Brandt | 327/108 |
| 6,392,452 B2 | * | 5/2002 | Lee | 327/108 |
| 6,617,844 B2 | * | 9/2003 | Lambert | 324/158.1 |
| 6,870,426 B2 | * | 3/2005 | Dashtestani et al. | 330/267 |
| 7,034,541 B2 | * | 4/2006 | Bertness et al. | 324/426 |
| 7,355,432 B2 | * | 4/2008 | Matsumoto | 324/765 |
| 2002/0000843 A1 | * | 1/2002 | Lee | 327/65 |
| 2006/0164133 A1 | * | 7/2006 | Fukui et al. | 327/108 |
| 2009/0219062 A1 | * | 9/2009 | Yanagi et al. | 327/108 |

\* cited by examiner

*Primary Examiner*—Jermele M Hollington
(74) *Attorney, Agent, or Firm*—Osha • Liang LLP

(57) ABSTRACT

There is provided a buffer circuit that outputs a signal according to an input signal. The buffer circuit includes a first receiving transistor that receives the input signal through its base terminal, a first clamp transistor having polarity same as that of the first receiving transistor, of which an emitter terminal and a collector terminal are connected to corresponding terminals of the first receiving transistor and which receives a first clamp voltage restricting a signal level output from the buffer circuit through its base terminal, and a first current defining section that is commonly provided for the first receiving transistor and the first clamp transistor and defines a total amount of emitter currents flowing into the first receiving transistor and the first clamp transistor. The buffer circuit outputs an output signal according to an emitter voltage of the first receiving transistor.

28 Claims, 10 Drawing Sheets

100

US 7,652,466 B2

BUFFER CIRCUIT, AMPLIFIER CIRCUIT, AND TEST APPARATUS

BACKGROUND

1. Technical Field

The present invention relates to a buffer circuit, an amplifier circuit, and a test apparatus. More particularly, the present invention relates to a buffer circuit that generates an output signal of which a signal level is restricted to a predetermined range, an amplifier circuit that uses this buffer circuit, and a test apparatus that uses this amplifier circuit.

2. Related Art

As a circuit that restricts a level of a signal, there has been known a circuit in which a forward-direction diode and a backward-direction diode are provided between a signal transmission path and a ground potential, for example. Moreover, a resistance is formed on the signal transmission path. Such a circuit can restrict a level of a signal to a range prescribed with forward-direction and backward-direction threshold voltages of the diodes. Moreover, the restriction range of the signal level can be adjusted by serially providing voltage sources in each diode, or the like.

However, in the above-described clamp circuit, input impedance and output impedance are determined by the resistance formed on the signal transmission path. For this reason, it is difficult to sufficiently increase the input impedance or to sufficiently decrease the output impedance.

Moreover, a frequency band of a signal passing through the above-described clamp circuit is restricted in accordance with a time constant determined by the resistance on the signal transmission path and junction capacitance of the diodes. For this reason, it is difficult to restrict a signal level of a high-frequency signal.

Moreover, it may be considered to combine a buffer circuit or an amplifier circuit with the above-described clamp circuit in order to restrict a signal level output from the buffer circuit or the amplifier circuit. However, the buffer circuit and the amplifier circuit using this clamp circuit also have a problem similar to the above-described problem.

SUMMARY

Therefore, it is an object of some aspects of the present invention to provide a buffer circuit, an amplifier circuit, and a test apparatus that can solve the foregoing problems. The above and other objects can be achieved by combinations described in the independent claims. The dependent claims define further advantageous and exemplary combinations of the present invention.

That is, according to the first aspect related to the innovations herein, one exemplary buffer circuit that outputs a signal according to an input signal may include: a first receiving transistor that receives the input signal through its base terminal; a first clamp transistor having polarity same as that of the first receiving transistor, of which an emitter terminal and a collector terminal are connected to corresponding terminals of the first receiving transistor and which receives a first clamp voltage restricting a signal level output from the buffer circuit through its base terminal; and a first current defining section that is commonly provided for the first receiving transistor and the first clamp transistor and defines a total amount of emitter currents flowing into the first receiving transistor and the first clamp transistor, in which the buffer circuit outputs an output signal according to an emitter voltage of the first receiving transistor.

That is, according to the second aspect related to the innovations herein, one exemplary amplifier circuit that amplifies an input signal and outputs the amplified signal may include: a buffer circuit that restricts a signal level of the input signal in accordance with a given clamp voltage; and an amplifier that amplifies a signal output from the buffer circuit and outputs the amplified signal, in which the buffer circuit is a buffer circuit of the first aspect.

That is, according to the third aspect related to the innovations herein, one exemplary test apparatus that tests a device under test may include: an amplifier circuit that amplifies a signal output from the device under test; a measuring section that measures a signal output from the amplifier circuit; and a deciding section that decides a quality of the device under test on the basis of a measurement result measured by the measuring section, in which the amplifier circuit is an amplifier circuit of the second aspect.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
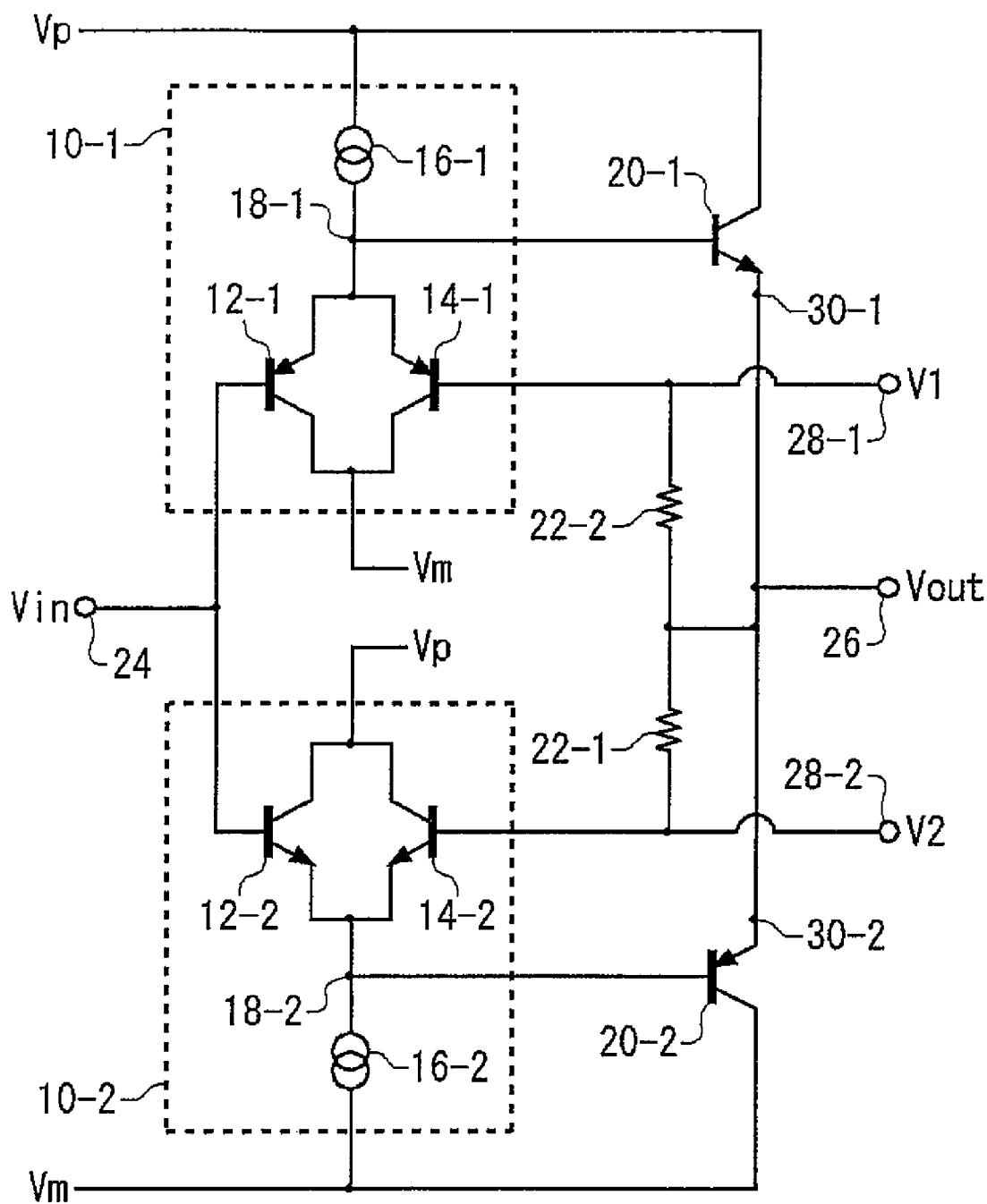
FIG. 1 is a view exemplary showing a configuration of a buffer circuit 100 according to an embodiment of the present invention.

FIG. 1 is a view exemplary showing a configuration of a buffer circuit 100 according to an embodiment of the present invention. The buffer circuit 100 outputs an output signal according to an input signal. Moreover, the buffer circuit 100 restricts a signal level Vout of the output signal in accordance with a given clamp voltage.

The buffer circuit 100 includes a first differential-pair circuit 10-1, a second differential-pair circuit 10-2, a first output transistor 20-1, a second output transistor 20-2, a first operation bias resistor 22-1, a second operation bias resistor 22-2, an input terminal 24, an output terminal 26, a first clamp terminal 28-1, and a second clamp terminal 28-2. In addition, the transistors to be described below may be a bipolar transistor or a MOS transistor. When a MOS transistor is used, in the following description, a base may correspond to a gate of the MOS transistor, an emitter may correspond to a source of the MOS transistor, and a collector may correspond to a drain of the MOS transistor.

The first differential-pair circuit 10-1 receives the input signal via the input terminal 24, and receives a first clamp voltage V1 via the first clamp terminal 28-1. The first clamp voltage V1 is a voltage restricting the signal level of the output signal output from the buffer circuit 100. For example, the first clamp voltage V1 may be a voltage defining an upper limit of the signal level Vout of the output signal. Moreover, an H-side power supply voltage Vp and an L-side power supply voltage Vm are provided to the first differential-pair circuit 10-1.

The first differential-pair circuit 10-1 has a first current defining section 16-1, a first receiving transistor 12-1, and a first clamp transistor 14-1. The first receiving transistor 12-1 and the first clamp transistor 14-1 have a same polarity, and corresponding terminals thereof are connected to each other. In other words, two emitter terminals are connected to each other, and two collector terminals are connected to each other. Moreover, the first receiving transistor 12-1 and the first clamp transistor 14-1 may be a PNP-type bipolar transistor or a P-type MOS transistor.

The first current defining section 16-1 is provided commonly to the first receiving transistor 12-1 and the first clamp transistor 14-1, and defines a total amount of emitter currents flowing into the first receiving transistor 12-1 and the first clamp transistor 14-1. The first current defining section 16-1 in the present example may be a constant current source or a resistor that is provided between a wire for the H-side power supply voltage Vp and the emitter terminals of the first receiving transistor 12-1 and the first clamp transistor 14-1.

The collector terminals of the first receiving transistor 12-1 and the first clamp transistor 14-1 are connected to a wire for the L-side power supply voltage Vm. By such a configuration, the first receiving transistor 12-1 and the first clamp transistor 14-1 operate as a differential pair.

The input signal is provided to a base terminal of the first receiving transistor 12-1. Moreover, the first clamp voltage V1 is provided to a base terminal of the first clamp transistor 14-1. As described above, the first receiving transistor 12-1 and the first clamp transistor 14-1 operate as a PNP-type differential pair. Moreover, among the first receiving transistor 12-1 and the first clamp transistor 14-1, one transistor of which voltage between the base and the emitter is larger than that of the other transistor is turned on.

For example, since the voltage between the base and the emitter of the first receiving transistor 12-1 becomes larger when a signal level Vin of the input signal is smaller than the first clamp voltage V1, the first receiving transistor 12-1 is turned on and the first clamp transistor 14-1 is turned off. In this case, the first receiving transistor 12-1 outputs a signal according to the signal level Vin of the input signal to a connecting point 18-1. More specifically, a signal level of the connecting point 18-1 of the emitter terminals becomes Vin+Vbe(12) (here, Vbe(12) is the voltage between the base and the emitter of the first receiving transistor 12-1).

Moreover, since the voltage between the base and the emitter of the first clamp transistor 14-1 becomes larger when the signal level Vin of the input signal is larger than the first clamp voltage V1, the first clamp transistor 14-1 is turned on and the first receiving transistor 12-1 is turned off. The first clamp transistor 14-1 outputs a signal having a signal level according to the first clamp voltage V1 to the connecting point 18-1. More specifically, a signal level of the connecting point 18-1 of the emitter terminals becomes V1+Vbe(14) (here, Vbe(14) is the voltage between the base and the emitter of the first clamp transistor 14-1).

The buffer circuit 100 outputs the output signal according to a voltage in the connecting point 18-1 of the emitter terminals. As described above, since the voltage in the connecting point 18-1 of the emitter terminals is restricted in accordance with the first clamp voltage V1, the signal level Vout of the output signal is also restricted by the first clamp voltage V1.

The first output transistor 20-1 has polarity different from that of the first receiving transistor 12-1 and the first clamp transistor 14-1, and its base terminal is connected to the connecting point 18-1 and its emitter terminal outputs an output signal according to a signal received through the base terminal. The first output transistor 20-1 may be an NPN-type bipolar transistor.

The emitter terminal of the first output transistor 20-1 is connected to the output terminal 26. A signal level of the emitter terminal of the first output transistor 20-1 becomes a level obtained by subtracting a voltage between the base and the emitter from a level of the signal received through the base terminal.

In other words, when the signal level Vin of the input signal is smaller than the first clamp voltage V1, the signal level of the emitter terminal of the first output transistor 20-1 becomes Vin+Vbe(12)−Vbe(20) (here, Vbe(20) is the voltage between the base and the emitter of the first output transistor 20-1). Moreover, when the signal level Vin of the input signal is larger than the first clamp voltage V1, the signal level of the emitter terminal of the first output transistor 20-1 becomes V1+Vbe(14)−Vbe(20).

Here, it is assumed that the voltages between the respective bases and the respective emitters of the first receiving transistor 12-1, the first clamp transistor 14-1, and the first output transistor 20-1 are substantially equal to one another. In this case, when the signal level Vin of the input signal is smaller than the first clamp voltage V1, the signal level of the emitter terminal of the first output transistor 20-1 becomes Vin, and when the signal level Vin of the input signal is larger than the first clamp voltage V1, the signal level of the emitter terminal of the first output transistor 20-1 becomes V1.

By such a configuration, it is possible to restrict an upper limit of the signal level of the output signal to the first clamp voltage V1 with high precision. Moreover, since a diode is not provided between a transmission path and a ground potential, it is possible to decrease capacitance between the transmission path and the ground potential and thus process a high-frequency signal. Moreover, since transistors are used in the input and output stages, it is possible to sufficiently decrease input impedance, and sufficiently increase output impedance.

The second differential-pair circuit 10-2 and the second output transistor 20-2 may operate similarly to the first differential-pair circuit 10-1 and the first output transistor 20-1. The second differential-pair circuit 10-2 receives the input signal via the input terminal 24, and receives a second clamp voltage V2 via the second clamp terminal 28-2. The second clamp voltage V2 is a voltage restricting the signal level Vout of the output signal output from the buffer circuit 100. For example, the second clamp voltage V2 may be a voltage defining a lower limit of the signal level Vout of the output signal. Moreover, an H-side power supply voltage Vp and an L-side power supply voltage Vm are provided to the second differential-pair circuit 10-2.

The second differential-pair circuit 10-2 has a second current defining section 16-2, a second receiving transistor 12-2, and a second clamp transistor 14-2. The second receiving transistor 12-2 is provided in parallel with the first receiving transistor 12-1. Moreover, the first receiving transistor 12-1 and the second clamp transistor 14-2 have polarity different from that of the first receiving transistor 12-1 and the first clamp transistor 14-1, and corresponding terminals thereof are connected to each other. The second receiving transistor 12-2 and the second clamp transistor 14-2 may be an NPN-type bipolar transistor.

The second current defining section 16-2 is commonly provided for the second receiving transistor 12-2 and the second clamp transistor 14-2, and defines a total amount of emitter currents flowing into the second receiving transistor 12-2 and the second clamp transistor 14-2. The second current defining section 16-2 in the present example may be a constant current source or a resistor that is provided between a wire for the L-side power supply voltage Vm and emitter terminals of the second receiving transistor 12-2 and the second clamp transistor 14-2.

Collector terminals of the second receiving transistor 12-2 and the second clamp transistor 14-2 are connected to a wire for the H-side power supply voltage Vp. By such a configuration, the second receiving transistor 12-2 and the second clamp transistor 14-2 operate as a differential pair.

The input signal is provided to a base terminal of the second receiving transistor 12-2. Moreover, the second clamp voltage V2 is provided to a base terminal of the second clamp transistor 14-2. As described above, the second receiving transistor 12-2 and the second clamp transistor 14-2 operate as an NPN-type differential pair. Moreover, among the second receiving transistor 12-2 and the second clamp transistor 14-2, one transistor of which a voltage between the base and the emitter is larger than that of the other transistor is turned on, and the other transistor is turned off.

For example, since the voltage between the base and the emitter of the second receiving transistor 12-2 becomes larger when the signal level Vin of the input signal is larger than the second clamp voltage V2, the second receiving transistor 12-2 is turned on and the second clamp transistor 14-2 is turned off. In this case, a signal level at a connecting point 18-2 between the emitter terminals becomes Vin−Vbe(12) (here, Vbe(12) is the voltage between the base and the emitter of the second receiving transistor 12-2).

Moreover, since the voltage between the base and the emitter of the second clamp transistor 14-2 becomes larger when the signal level Vin of the input signal is smaller than the second clamp voltage V2, the second clamp transistor 14-2 is turned on and the second receiving transistor 12-2 is turned off. In this case, a signal level at the connecting point 18-2 between the emitter terminals becomes V1−Vbe(14) (here, Vbe(14) is the voltage between the base and the emitter of the second clamp transistor 14-2).

The second output transistor 20-2 has polarity different from that of the second receiving transistor 12-2 and the second clamp transistor 14-2, and its base terminal is connected to the connecting point 18-2 and its emitter terminal outputs an output signal according to a signal received through the base terminal. The second output transistor 20-2 may be a PNP-type bipolar transistor.

The emitter terminal of the second output transistor 20-2 is connected to the emitter terminal of the first output transistor 20-1, and this connecting point is connected to the output terminal 26. A signal level of the emitter terminal of the second output transistor 20-2 becomes a level obtained by adding a voltage between the base and the emitter to a level of the signal received through the base terminal.

In other words, when the signal level Vin of the input signal is larger than the first clamp voltage V1, the signal level of the emitter terminal of the first output transistor 20-1 becomes Vin−Vbe(12)+Vbe(20) (here, Vbe(20) is the voltage between the base and the emitter of the second output transistor 20-2). Moreover, when the signal level Vin of the input signal is smaller than the second clamp voltage V2, the signal level of the emitter terminal of the second output transistor 20-2 becomes V1−Vbe(14)+Vbe(20).

Here, it is assumed that the voltages between the respective bases and the respective emitters of the second receiving transistor 12-2, the second clamp transistor 14-2, and the second output transistor 20-2 are substantially equal to one another. In this case, when the signal level Vin of the input signal is larger than the second clamp voltage V2, the signal level of the emitter terminal of the second output transistor 20-2 becomes Vin, and when the signal level Vin of the input signal is smaller than the second clamp voltage V2, the signal level of the emitter terminal of the second output transistor 20-2 becomes V2. By such a configuration, it is possible to restrict a lower limit of the signal level Vout of the output signal to the second clamp voltage V2 with high precision.

Figure 2:
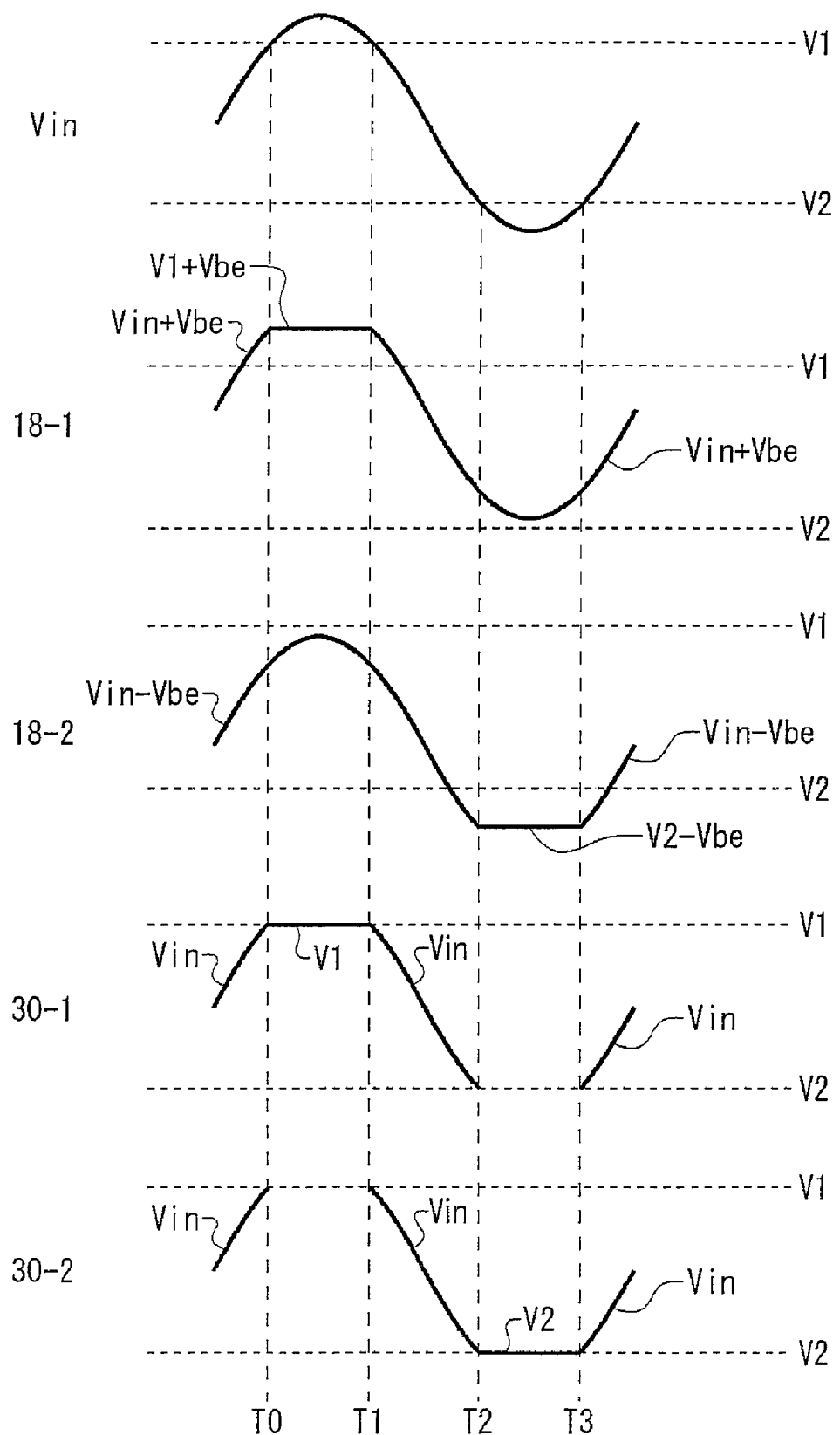
FIG. 2 is a view exemplary describing an operation of the buffer circuit 100.

FIG. 2 is a view exemplary describing an operation of the buffer circuit 100. FIG. 2 exemplary shows each waveform of the input signal Vin, a signal at the connecting point 18-1, a signal at the connecting point 18-2, a signal of an emitter terminal 30-1 of the first output transistor 20-1, and a signal of an emitter terminal 30-2 of the second output transistor 20-2.

As shown in FIG. 2, the signal level Vin of the input signal in a first time interval (to T0), a third time interval (T1 to T2), and a fifth time interval (after T3) is smaller than the first clamp voltage V1 and is larger than the second clamp voltage V2. Moreover, the signal level Vin of the input signal in a second time interval (T0 to T1) is larger than the first clamp voltage V1. Moreover, the signal level Vin of the input signal in a fourth time interval (T2 to T3) is smaller than the second clamp voltage V2.

As described above, in the first, the third, and the fifth time intervals, the first receiving transistor 12-1 and the second receiving transistor 12-2 are turned on, and the first clamp transistor 14-1 and the second clamp transistor 14-2 are turned off. For this reason, the signal level at the connecting point 18-1 becomes Vin+Vbe (Vbe is a voltage between a base and an emitter, which is common to each transistor), and the signal level at the connecting point 18-2 becomes Vin−Vbe. Moreover, since the first output transistor 20-1 and the second output transistor 20-2 are turned on, the signal levels at the emitter terminal 30-1 and the emitter terminal 30-2 become Vin. In other words, when the signal level Vin of the input signal is within a range (V2 to V1) defined by the clamp voltages, the buffer circuit 100 passes the input signal.

Moreover, in the second time interval, the first clamp transistor 14-1 and the second receiving transistor 12-2 are turned on, and the first receiving transistor 12-1 and the second clamp transistor 14-2 are turned off. For this reason, the signal level at the connecting point 18-1 is clamped to V1+Vbe, and the signal level at the connecting point 18-2 becomes Vin−Vbe.

Moreover, in the second time interval, since it becomes Vout−Vbe(20-2)<Vin−Vbe(12-2), the second output transistor 20-2 is turned off and the first output transistor 20-1 is turned on. For this reason, the signal level of the emitter terminal 30-1 becomes V1, and the signal level of the emitter terminal 30-2 is determined by the signal level of the emitter terminal 30-1.

However, since the second output transistor 20-2 is turned off, it is impossible to supply bias currents of the first output transistor 20-1 via the second output transistor 20-2. For this reason, the buffer circuit 100 provides the first operation bias resistor 22-1 between the emitter terminal of the first output transistor 20-1 and the base terminal of the second clamp transistor 14-2. According to this, it is possible to supply the bias currents of the first output transistor 20-1 from the second clamp terminal 28-2.

Similarly, in the fourth time interval, the first receiving transistor 12-1, the second clamp transistor 14-2, and the second output transistor 20-2 are turned on, and the first clamp transistor 14-1, the second receiving transistor 12-2, and the first output transistor 20-1 are turned off. For this reason, the signal level of the emitter terminal 30-2 becomes V2, and the signal level of the emitter terminal 30-1 is determined by the signal level of the emitter terminal 30-2.

Moreover, in order to supply bias currents to the second output transistor 20-2 in the fourth time interval, the buffer circuit 100 has the second operation bias resistor 22-2 that is provided between the emitter terminal of the second output transistor 20-2 and the base terminal of the first clamp transistor 14-1. According to this, it is possible to supply the bias currents of the second output transistor 20-2 from the first clamp terminal 28-1. As described above, the buffer circuit 100 can restrict the signal level Vout of the output signal by means of the set clamp voltages with high precision.

Figure 3:
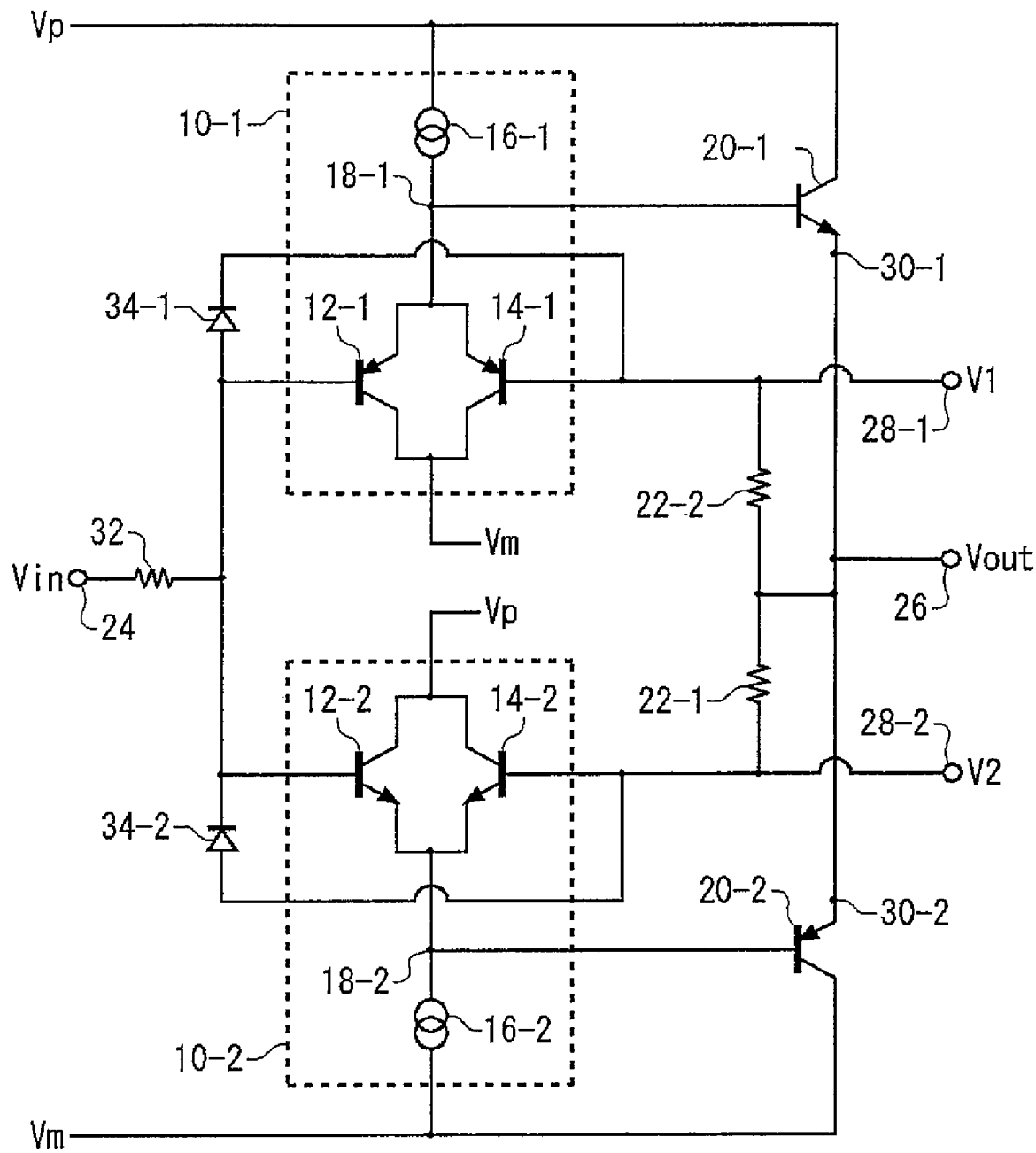
FIG. 3 is a view exemplary showing another configuration of the buffer circuit 100.

FIG. 3 is a view exemplary showing another configuration of the buffer circuit 100. The buffer circuit 100 in the present example further includes a receiving-side resistor 32 and two first diodes (34-1 and 34-2) in addition to the configuration of the buffer circuit 100 described with reference to FIG. 1 and FIG. 2. The other components of this configuration may be equal to those of the buffer circuit 100 described in FIG. 1 and FIG. 2.

The receiving-side resistor 32 is provided between the input terminal 24 receiving the input signal and the base terminals of the first receiving transistor 12-1 and the second receiving transistor 12-2. For example, one end of the receiving-side resistor 32 is connected to a connecting point between the base terminals of the first receiving transistor 12-1 and the second receiving transistor 12-2, and the other end is connected to the input terminal 24.

The first diode 34-1 is provided between the base terminal of the first receiving transistor 12-1 and the base terminal of the first clamp transistor 14-1. For example, the first diode 34-1 is provided so that a direction facing from the base terminal of the first receiving transistor 12-1 to the base terminal of the first clamp transistor 14-1 becomes a forward direction.

By such a configuration, it is possible to restrict a signal input into the base terminal of the first receiving transistor 12-1 in accordance with a forward-direction voltage of the first diode 34-1. According to this, it is possible to prevent the first receiving transistor 12-1 from operating in a saturation range, and prevent electric charges from being accumulated in a base area of the first receiving transistor 12-1. For this reason, the first receiving transistor 12-1 can operate at high speed.

Moreover, it is possible to restrain electric currents flowing from the input terminal 24 by providing the receiving-side resistor 32. Moreover, since the signal level Vin of the input signal is stepped down by the receiving-side resistor 32 and the decreased signal level is compared with a clamp voltage, it is possible to enlarge a range of the signal level of the input signal restricted by the clamp voltage.

The first diode 34-2 is provided between the base terminal of the second receiving transistor 12-2 and the base terminal of the second clamp transistor 14-2. For example, the first diode 34-2 is provided so that a direction facing from the base terminal of the second receiving transistor 12-2 to the base terminal of the second clamp transistor 14-2 becomes a backward direction. By such a configuration, the second receiving transistor 12-2 can operate at high speed.

Figure 4:
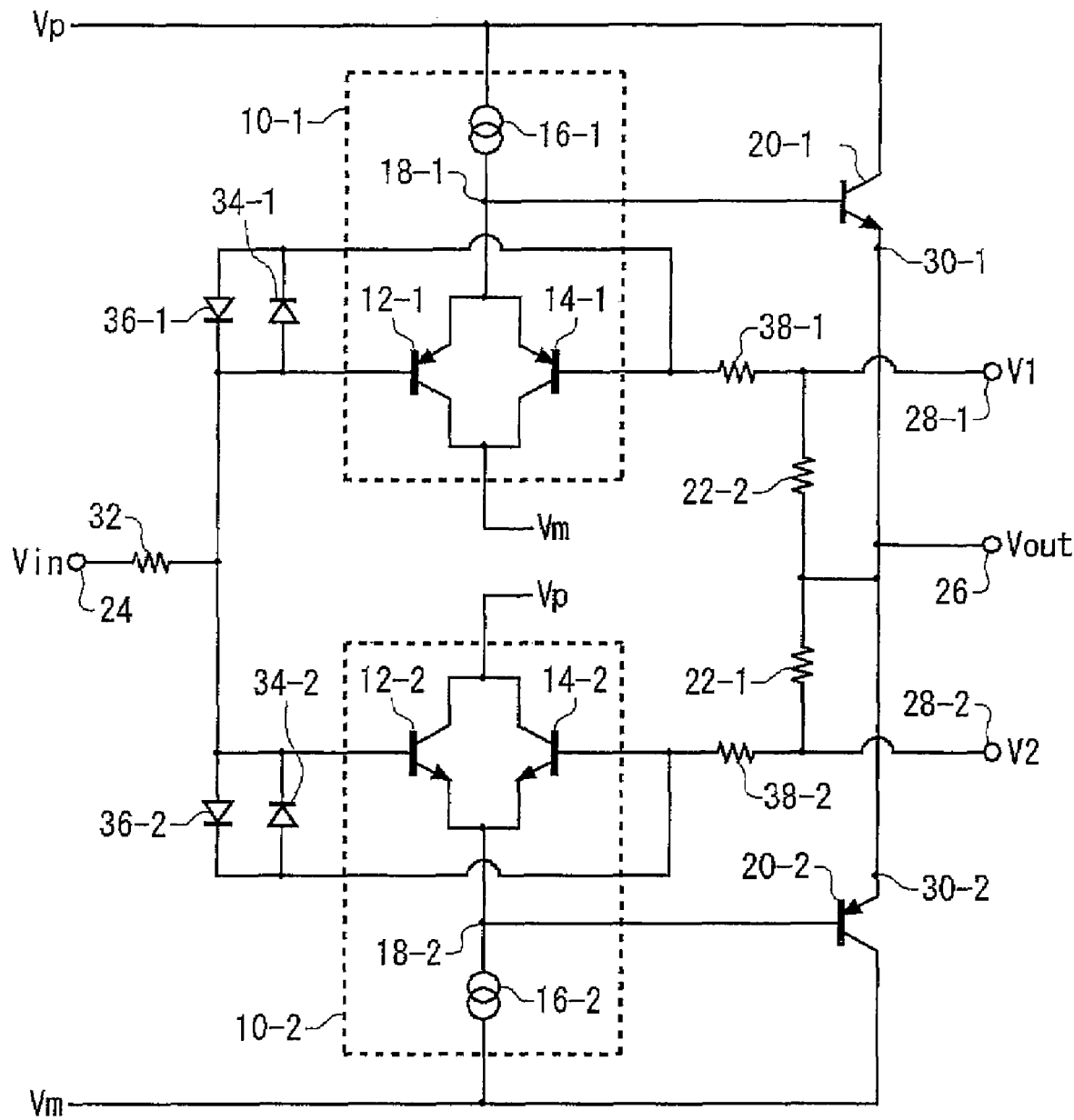
FIG. 4 is a view exemplary showing another configuration of the buffer circuit 100.

FIG. 4 is a view exemplary showing another configuration of the buffer circuit 100. The buffer circuit 100 in the present example further includes two clamp-side resistors (38-1 and 38-2) and two second diodes (36-1 and 36-2) in addition to the configuration of the buffer circuit 100 described with reference to FIG. 3. The other components of this configuration may be equal to those of the buffer circuit 100 described in FIG. 3.

The clamp-side resistor 38-1 is provided between the base terminal of the first clamp transistor 14-1 and the first clamp terminal 28-1 receiving the first clamp voltage V1. For example, one end of the clamp-side resistor 38-1 is connected to a connecting point between the base terminal of the first clamp transistor 14-1 and the first diode 34-1, and the other end is connected to the first clamp terminal 28-1.

The second diode 36-1 is provided in parallel with the first diode 34-1 between the base terminal of the first receiving transistor 12-1 and the base terminal of the first clamp transistor 14-1, and has polarity different from that of the first diode 34-1. For example, the second diode 36-1 is provided so that a direction facing from the base terminal of the first receiving transistor 12-1 to the base terminal of the first clamp transistor 14-1 becomes a backward direction.

By such a configuration, it is possible to restrict a voltage input into the base terminal of the first clamp transistor 14-1 in accordance with a backward-direction voltage of the second diode 36-1. According to this, it is possible to prevent the first clamp transistor 14-1 from operating in a saturation range, and operate the first clamp transistor 14-1 at high speed. Moreover, it is possible to restrain electric currents flowing from the first clamp terminal 28-1 by providing the clamp-side resistor 38-1. Moreover, it is possible to enlarge the range of the signal level of the input signal restricted by the clamp voltage.

The clamp-side resistor 38-2 is provided between the base terminal of the second clamp transistor 14-2 and the second clamp terminal 28-2 receiving the second clamp voltage V1. For example, one end of the clamp-side resistor 38-2 is connected to a connecting point between the base terminal of the second clamp transistor 14-2 and the first diode 34-2, and the other end is connected to the second clamp terminal 28-2.

The second diode 36-2 is provided in parallel with the first diode 34-2 between the base terminal of the second receiving transistor 12-2 and the base terminal of the second clamp transistor 14-2, and has polarity different from that of the first diode 34-2. For example, the second diode 36-2 is provided so that a direction facing from the base terminal of the second receiving transistor 12-2 to the base terminal of the second clamp transistor 14-2 becomes a forward direction.

By such a configuration, it is possible to restrict a voltage input into the base terminal of the second clamp transistor 14-2 in accordance with a forward-direction voltage of the second diode 36-2. According to this, the second clamp transistor 14-2 can operate at high speed. Moreover, it is possible to restrain electric currents flowing from the second clamp terminal 28-2 by providing the clamp-side resistor 38-2.

Moreover, it is possible to enlarge the range of the signal level of the input signal restricted by the clamp voltage.

Figure 5:
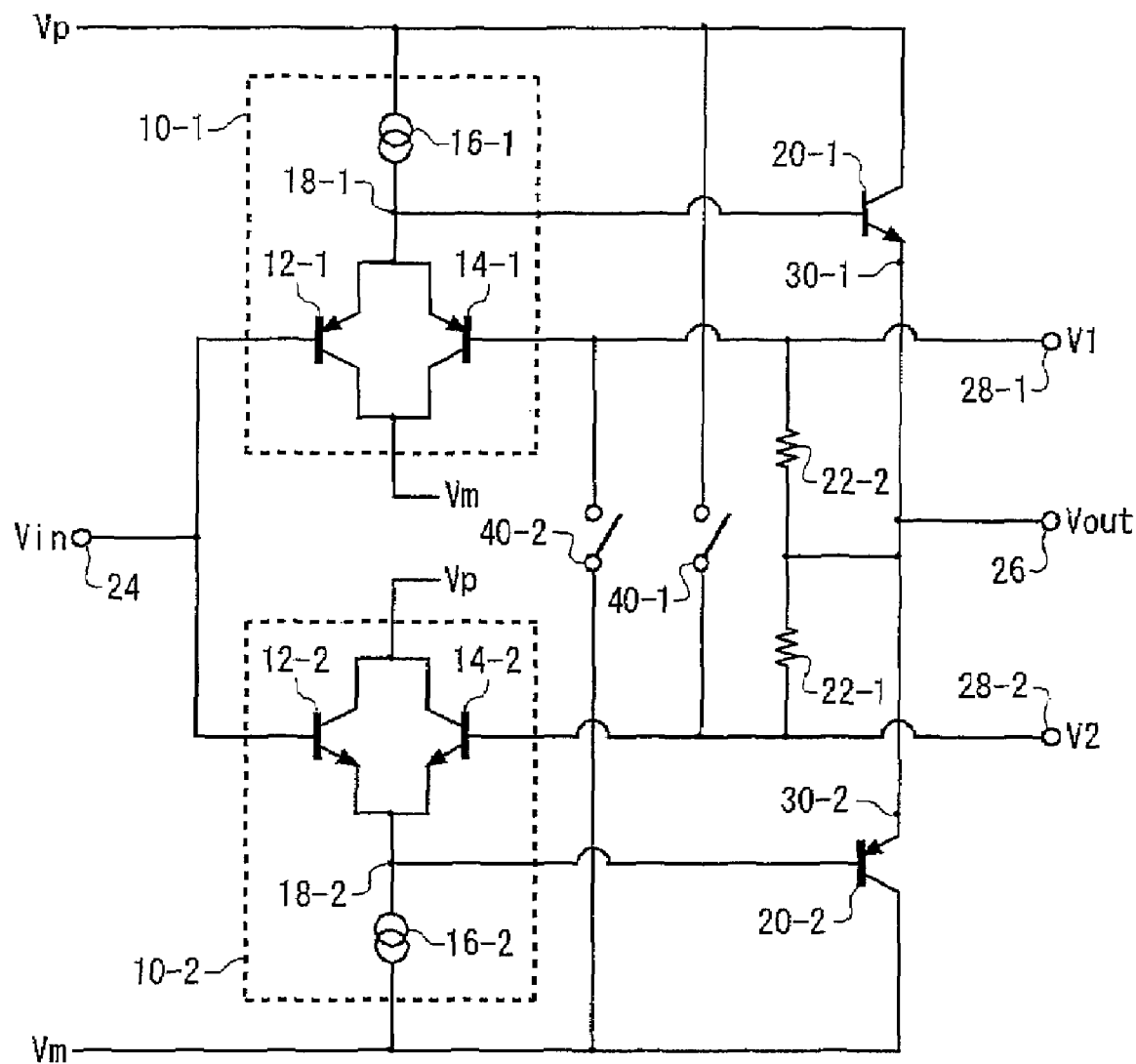
FIG. 5 is a view exemplary showing another configuration of the buffer circuit 100.

FIG. 5 is a view exemplary showing another configuration of the buffer circuit 100. The buffer circuit 100 in the present example further includes a first switch 40-1 and a second switch 40-2 in addition to the configurations of the buffer circuits 100 described with reference to FIG. 1 to FIG. 4. FIG. 5 shows a configuration obtained by adding the first switch 40-1 and the second switch 40-2 to the configuration of the buffer circuit 100 shown in FIG. 1.

The first switch 40-1 is provided between a wire applying the H-side power supply voltage Vp to the first differential-pair circuit 10-1 and a wire applying the second clamp voltage V2 to the second clamp transistor 14-2, and selects whether both wires are electrically connected to each other. Moreover, the second switch 40-2 is provided between a wire applying the L-side power supply voltage Vm to the second differential-pair circuit 10-2 and a wire applying the first clamp voltage V1 to the first clamp transistor 14-1, and selects whether both wires are electrically connected to each other.

When generating the output signal according to the input signal, the buffer circuit 100 may control the first switch 40-1 and the second switch 40-2 to be turned off. Moreover, when not generating the output signal according to the input signal, the buffer circuit 100 may control the first switch 40-1 and the second switch 40-2 to be turned on. The buffer circuit 100 may further include a switch control section that controls the first switch 40-1 and the second switch 40-2 on the basis of whether the output signal according to the input signal is generated or not.

Moreover, in place of the first switch 40-1 and the second switch 40-2, the switch control section may control whether it causes the first current defining section 16-1 and the second current defining section 16-2 to flow electric currents or not. In this case, the buffer circuit 100 may not include the first switch 40-1 and the second switch 40-2. For example, when generating the output signal according to the input signal, the switch control section may cause the first current defining section 16-1 and the second current defining section 16-2 to flow predetermined electric currents. Moreover, when not generating the output signal according to the input signal, the switch control section may cause the first current defining section 16-1 and the second current defining section 16-2 not substantially to flow electric currents. By such a configuration, it is possible to control whether the buffer circuit 100 generates the output signal or not.

Figure 6:
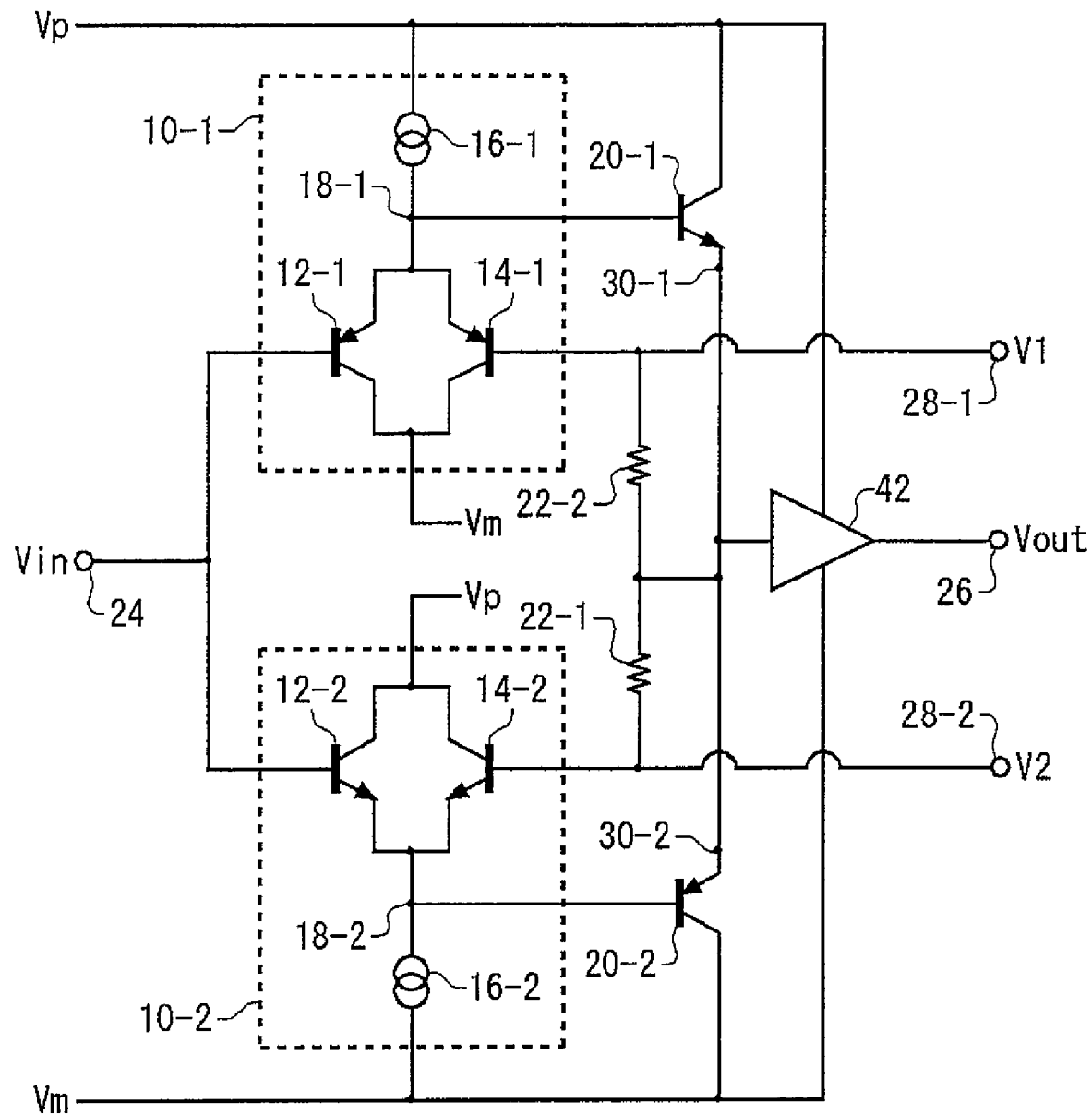
FIG. 6 is a view exemplary showing another configuration of the buffer circuit 100.

FIG. 6 is a view exemplary showing another configuration of the buffer circuit 100. The buffer circuit 100 in the present example further includes an output buffer 42 in addition to the configurations of the buffer circuits 100 described with reference to FIG. 1 to FIG. 5. FIG. 6 shows a configuration obtained by adding the output buffer 42 to the configuration of the buffer circuit 100 shown in FIG. 1.

The output buffer 42 receives a signal at the connecting point between the first output transistor 20-1 and the second output transistor 20-2, and outputs a signal according to this received signal. In the buffer circuits 100 shown in FIG. 1 to FIG. 5, either the first output transistor 20-1 or the second output transistor 20-2 is turned off in operating the clamp. For this reason, at the time of the clamp operation, when outputting a positive voltage to generate a sink current or when outputting a negative voltage to generate a source current, the output impedance of the buffer circuit 100 is increased.

The buffer circuit 100 in the present example uses a buffer having small output impedance even at the above-described operation as the output buffer 42. According to this, even in the above-described operation, it is possible to decrease the output impedance of the buffer circuit 100.

Figure 7:
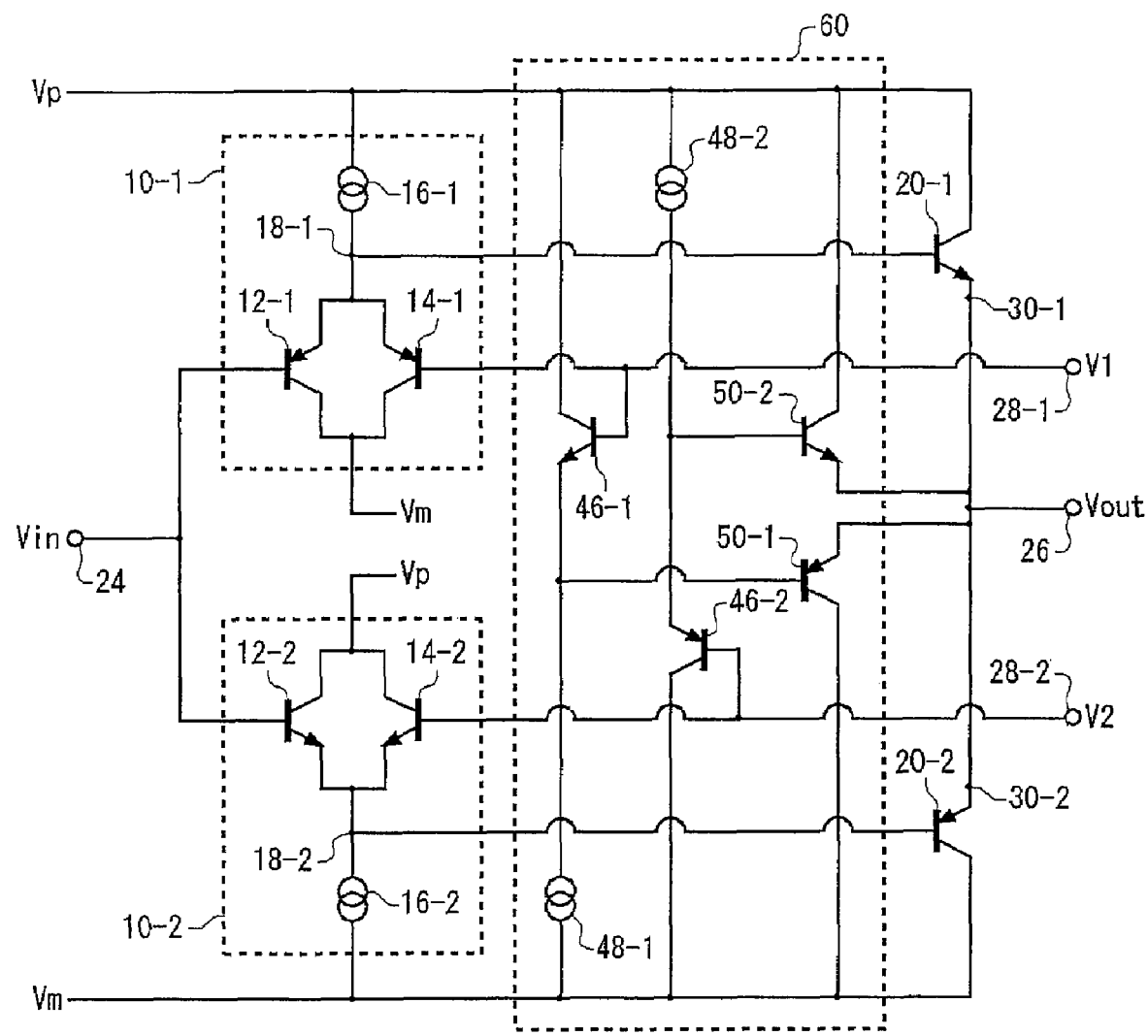
FIG. 7 is a view exemplary showing another configuration of the buffer circuit 100.

FIG. 7 is a view exemplary showing another configuration of the buffer circuit 100. Unlike the configurations of the buffer circuits 100 described with reference to FIG. 1 to FIG. 6, the buffer circuit 100 in the present example includes a current supplying section 60 in place of the first operation bias resistor 22-1 and the second operation bias resistor 22-2.

The current supplying section 60 generates operation bias currents of the first output transistor 30-1 and the second output transistor 30-2 during a clamp operation. The current supplying section 60 has a first operation bias transistor 50-1, a second operation bias transistor 50-2, a first control transistor 46-1, a second control transistor 46-2, a first control current source 48-1, and a second control current source 48-2.

The first operation bias transistor 50-1 is, for example, a PNP-type transistor. An emitter terminal of the first operation bias transistor 50-1 is connected to the emitter terminal of the first output transistor 30-1, a collector terminal thereof is connected to the wire for the L-side power supply voltage Vm, and a base terminal thereof is connected to an emitter terminal of the first control transistor 46-1. The base terminal of the first operation bias transistor 50-1 receives a constant voltage of V1–Vbe(46-1) from the first control transistor 46-1.

Moreover, since an emitter voltage of the first output transistor 20-1 is given to the emitter terminal of the first operation bias transistor 50-1, an emitter voltage of Vout=Vin is provided to the emitter terminal of the first operation bias transistor 50-1 when the first differential-pair circuit 10-1 does not perform a clamp operation in accordance with the first clamp voltage V1. At this time, since it is Vout<V1, a voltage between the base and the emitter is not sufficiently applied to the first operation bias transistor 50-1, and thus the first operation bias transistor 50-1 is turned off.

Moreover, when the first differential-pair circuit 10-1 performs the clamp operation in accordance with the first clamp voltage V1, an emitter voltage of Vout=V1 is provided to the emitter terminal of the first operation bias transistor 50-1. In this case, the voltage between the base and the emitter is sufficiently applied to the first operation bias transistor 50-1, and thus the first operation bias transistor 50-1 is turned on. In this case, as described above, although the second output transistor 20-2 is turned off, it is possible to supply operation bias currents to the first output transistor 20-1 via the first operation bias transistor 50-1. A current source for generating operation bias currents may be connected to the collector terminal of the first operation bias transistor 50-1.

The second operation bias transistor 50-2 is, for example, an NPN-type transistor. An emitter terminal of the second operation bias transistor 50-2 is connected to the emitter terminal of the second output transistor 30-1, a collector terminal thereof is connected to the wire for the H-side power supply voltage Vp, and a base terminal thereof is connected to an emitter terminal of the second control transistor 46-2. The second operation bias transistor 50-2 is also turned on by an operation similar to that of the first operation bias transistor 50-1 when the first output transistor 20-1 is turned off, and then supplies operation bias currents to the second output transistor 20-2. A current source for generating operation bias currents may be connected to the collector terminal of the second operation bias transistor 50-2.

The first control transistor 46-1 is, for example, an NPN-type transistor. An emitter terminal of the first control transistor 46-1 is connected to the base terminal of the first operation bias transistor 50-1, a collector terminal thereof is connected to the wire for the H-side power supply voltage Vp, and a base terminal thereof is connected to the first clamp terminal 28-1. As described above, when the emitter voltage of the first output transistor 20-1 becomes the first clamp voltage V1, the first control transistor 46-1 supplies a constant voltage obtained by subtracting a voltage between the base and the emitter from the first clamp voltage V1 to the base terminal of the first operation bias transistor 50-1, so that the first operation bias transistor 50-1 is turned on. Moreover, the first control current source 48-1 generates operation bias currents of the first control transistor 46-1.

The second control transistor 46-2 is, for example, a PNP-type transistor. An emitter terminal of the second control transistor 46-2 is connected to the base terminal of the second operation bias transistor 50-2, a collector terminal thereof is connected to the wire for the L-side power supply voltage Vm, and a base terminal thereof is connected to the second clamp terminal 28-2. As described above, when an emitter voltage of the second output transistor 20-2 becomes the second clamp voltage V2, the second control transistor 46-2 supplies a constant voltage obtained by adding a voltage between the base and the emitter to the second clamp voltage V2 to the base terminal of the second operation bias transistor 50-2, so that the second operation bias transistor 50-2 is turned on. Moreover, the second control current source 48-2 generates operation bias currents of the second control transistor 46-2.

By such a configuration, without using the operation bias resistors 22, it is possible to generate the operation bias currents of the output transistors 30 during the clamp operations. For this reason, it is possible to decrease the output impedance of the buffer circuit 100 during the clamp operations. Moreover, since the first control transistor 46-1 and the second control transistor 46-2 are an element for generating a constant voltage obtained by adding or subtracting the voltage between the base and the emitter to or from the clamp voltage, the control transistors may be replaced by diodes having polarity according to each transistor.

Figure 8:
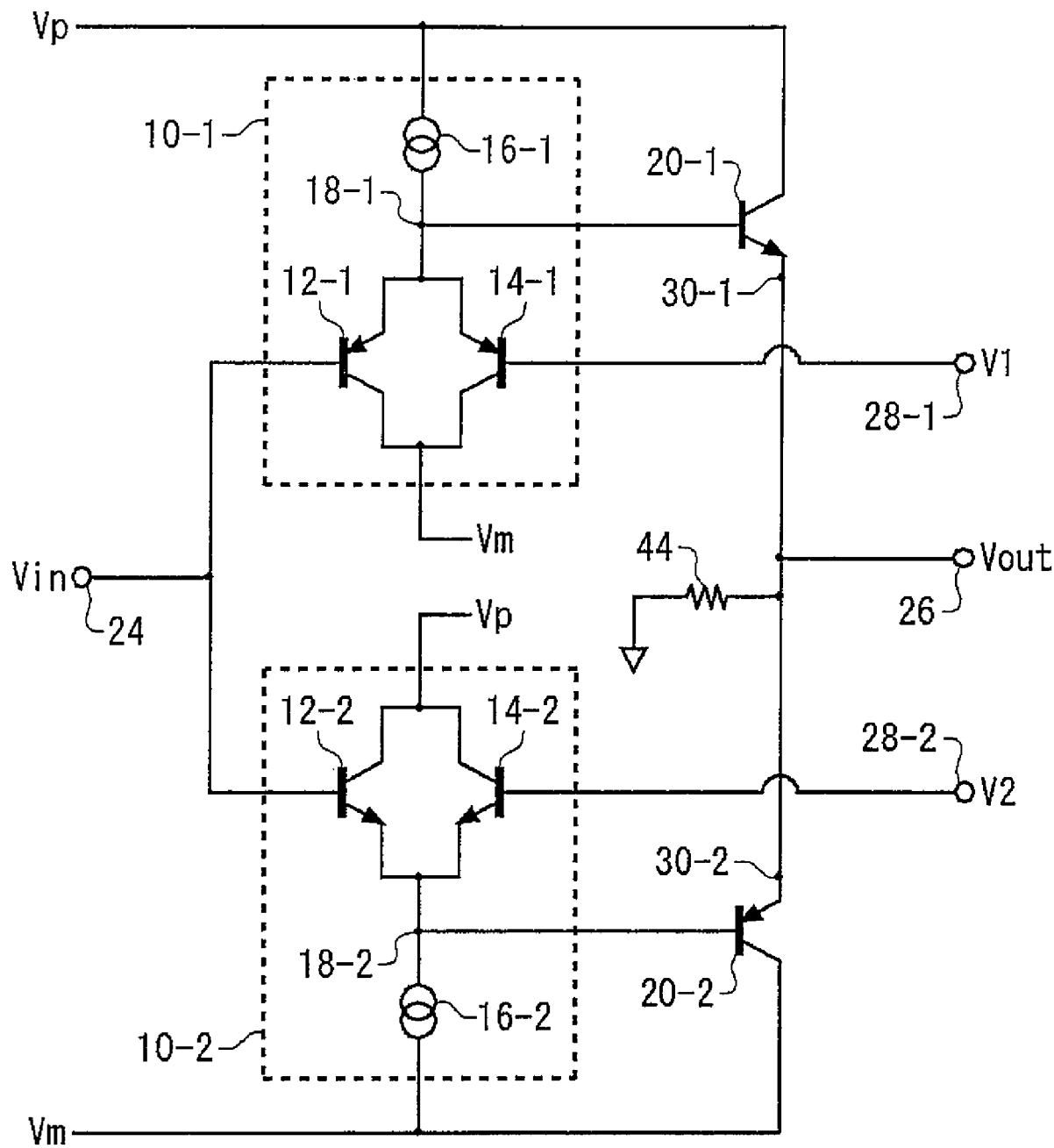
FIG. 8 is a view exemplary showing another configuration of the buffer circuit 100.

FIG. 8 is a view exemplary showing another configuration of the buffer circuit 100. Unlike the configurations of the buffer circuits 100 described with reference to FIG. 1 to FIG. 6, the buffer circuit 100 in the present example includes a common operation bias resistor 44 in place of the first operation bias resistor 22-1 and the second operation bias resistor 22-2.

The common operation bias resistor 44 connects the emitter terminals of the first output transistor 20-1 and the second output transistor 20-2 to an electric potential between the first clamp voltage V1 and the second clamp voltage V2. The electric potential between the first clamp voltage V1 and the second clamp voltage V2 may be a midpoint voltage of the first clamp voltage V1 and the second clamp voltage V2.

For example, when it is V1=−V2, the common operation bias resistor 44 may connect the emitter terminals of the first output transistor 20-1 and the second output transistor 20-2 to the ground potential. By such a configuration, at the time of the clamp operation, it is also possible to supply the operation bias currents to the first output transistor 20-1 and the second output transistor 20-2.

Figure 9:
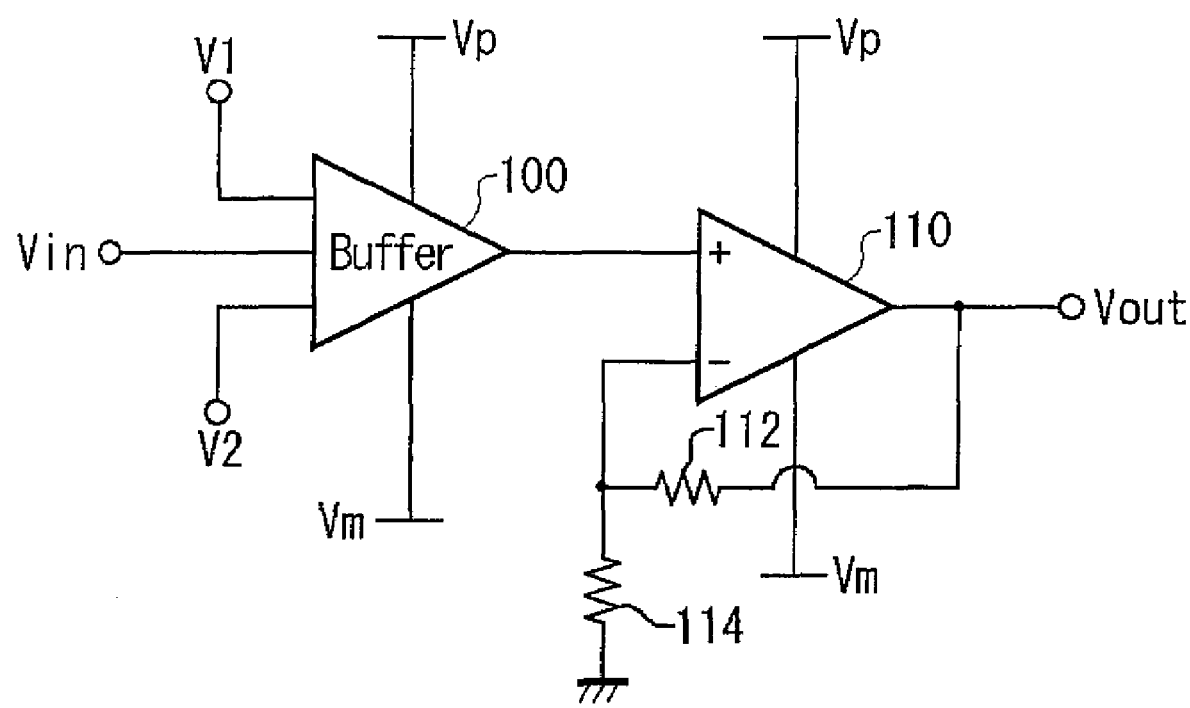
FIG. 9 is a view exemplary showing a configuration of an amplifier circuit 200 according to an embodiment of the present invention.

FIG. 9 is a view exemplary showing a configuration of an amplifier circuit 200 according to an embodiment of the present invention. The amplifier circuit 200 is a circuit that amplifies an input signal and outputs the amplified signal, and includes a buffer circuit 100 and an amplifier 110.

The buffer circuit 100 may be one of the buffer circuits 100 described in FIG. 1 to FIG. 8. The input signal is input into the buffer circuit 100, and the H-side power supply voltage Vp, the L-side power supply voltage Vm, the first clamp voltage V1, and the second clamp voltage V2 are provided to the buffer circuit 100.

The amplifier 110 amplifies the signal output from the buffer circuit 100 and outputs the amplified signal. For example, the amplifier 110 is a differential amplifier circuit, and receives the output signal of the buffer circuit 100 through its positive input terminal. Moreover, its negative input terminal is connected to the ground potential via a resistor 114, and an output terminal of the amplifier 110 is connected to the negative input terminal via a resistor 112. Moreover, the H-side power supply voltage Vp and the L-side power supply voltage Vm are provided to the amplifier 110. The amplifier 110 may amplify the output signal of the buffer circuit 100 at an amplification factor according to a resistance ratio of the resistors 112 and 114 within a range of a given power supply voltage.

The buffer circuit 100 may restrict the signal level of the output signal in accordance with an input voltage range permitted by the amplifier 110. Moreover, the amplifier circuit 200 may divide the power supply voltage at a predetermined division ratio, in order to generate a clamp voltage to be provided to the buffer circuit 100. By such a configuration, in accordance with the input voltage range of the amplifier 110, it is possible to restrict the signal level of the input signal with high precision. For this reason, it is possible to amplify the input signal with high precision.

Moreover, the amplifier 110 may be an operational amplifier. In this case, the buffer circuit 100 may be connected to a non-inverting input of the operational amplifier. Moreover, the buffer circuit 100 and the amplifier 110 may function as one amplifier by combination.

Figure 10:
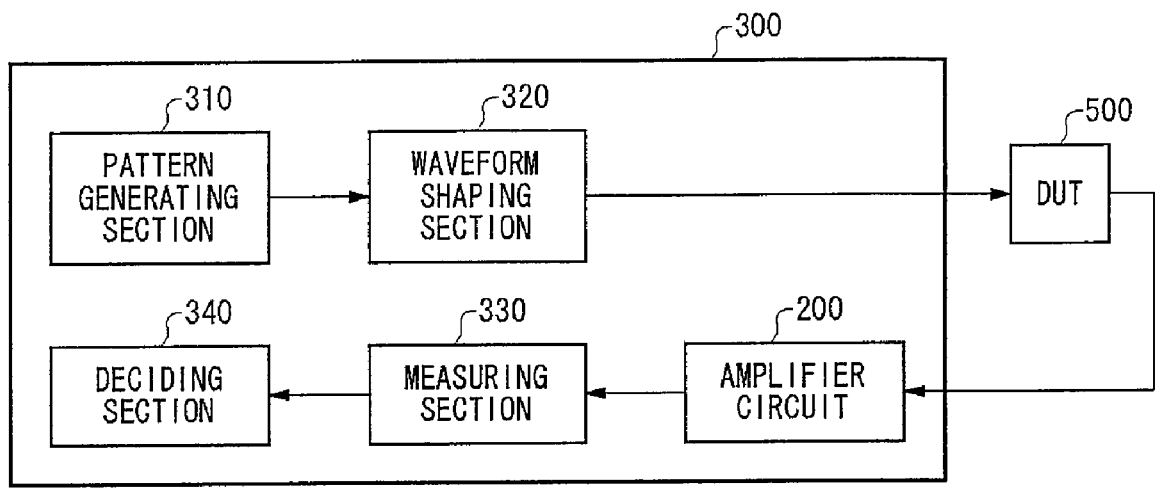
FIG. 10 is a view exemplary showing a configuration of a test apparatus 300 according to an embodiment of the present invention.

FIG. 10 is a view exemplary showing a configuration of a test apparatus 300 according to an embodiment of the present invention. The test apparatus 300 is an apparatus that tests a device under test 500 such as a semiconductor circuit, and includes a pattern generating section 310, a waveform shaping section 320, an amplifier circuit 200, a measuring section 330, and a deciding section 340.

The pattern generating section 310 generates a test pattern such as a logical pattern of a test signal and a pattern of a control signal to be input into the device under test 500. The waveform shaping section 320 shapes the test signal on the basis of the test pattern received from the pattern generating section 310, and inputs the shaped signal into the device under test 500.

The amplifier circuit 200 amplifies a measured signal output from the device under test 500 in accordance with the test signal. For example, the amplifier circuit 200 may amplify amplitude of the measured signal in accordance with a characteristic of the measuring section 330. The amplifier circuit 200 may be the amplifier circuit 200 described with reference to FIG. 9.

The measuring section 330 measures the measured signal amplified by the amplifier circuit 200. For example, the measuring section 330 may compare a signal level of the measured signal with a predetermined threshold value, in order to convert the measured signal into a binary signal. The amplifier circuit 200 may amplify the measured signal at an amplification factor according to this threshold value. Then, the measuring section 330 may sample the measured signal in accordance with a bit rate, in order to detect a logical value pattern of the measured signal.

The deciding section 340 decides a quality of the device under test 500 on the basis of a measurement result measured by the measuring section 330. For example, the deciding section 340 may compare the logical value pattern detected by the measuring section 330 with a given expectation pattern, in order to decide the quality of the device under test 500. The pattern generating section 310 may generate this expectation pattern on the basis of the test pattern.

According to the test apparatus 300, since the measured signal can be amplified in the amplifier circuit 200 with high precision, it is possible to detect a logical pattern of the measured signal with high precision. For this reason, it is possible to test the device under test 500 with high precision. Moreover, since levels of the signals input into the amplifier 110 and the measuring section 330 can be restricted to a predetermined range with high precision, it is possible to prevent the amplifier 110 or the like from operating in a saturation range and operate the amplifier 110 or the like with high precision. Moreover, it is possible to prevent a failure of the amplifier 110 or the like.

Figure 11:
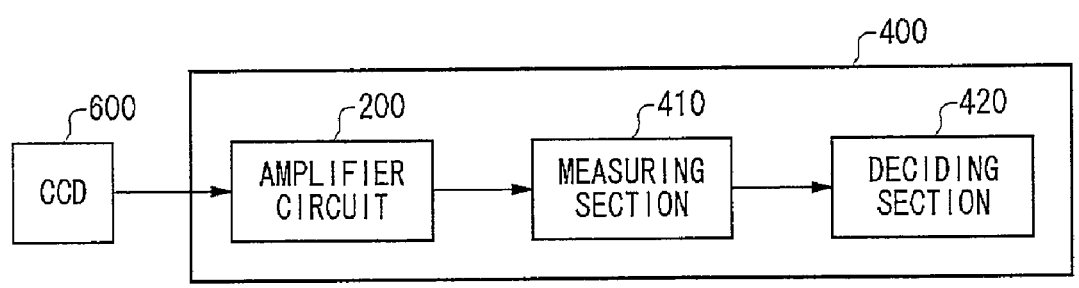
FIG. 11 is a view exemplary showing a configuration of a test apparatus 400 according to an embodiment of the present invention.

FIG. 11 is a view exemplary showing a configuration of a test apparatus 400 according to an embodiment of the present invention. The test apparatus 400 is an apparatus that tests a device under test 600 such as a charge-coupled device (CCD), and includes an amplifier circuit 200, a measuring section 410, and a deciding section 420. When causing the device under test 600 such as a CCD to take an image predetermined in a predetermined condition, the test apparatus 400 may decide a quality of the device under test 600 on the basis of a signal output from the device under test 600.

The amplifier circuit 200 amplifies a measured signal output from the device under test 600. For example, the amplifier circuit 200 may amplify amplitude of the measured signal in accordance with a characteristic of the measuring section 410. The amplifier circuit 200 may be the amplifier circuit 200 described with reference to FIG. 9.

The measuring section 410 measures the measured signal output from the amplifier circuit 410. For example, the measuring section 410 may measure a waveform of the measured signal by means of an analog-to-digital converter. The deciding section 420 decides pass/fail of the device under test 600 on the basis of a measurement result measured by the measuring section 410. For example, the deciding section 420 may decide pass/fail of the device under test 600 according to whether an electrical characteristic, a frequency characteristic, and so on of the measured signal measured by the measuring section 410 satisfy a predetermined specification.

According to the test apparatus 400, since the measured signal can be amplified in the amplifier circuit 200 with high precision, it is possible to measure the measured signal with high precision. For this reason, it is possible to test the device under test 600 with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above-mentioned descriptions, according to an embodiment of the present invention, it is possible to realize a buffer circuit for controlling a signal level of an output signal in accordance with a set clamp voltage with high precision. Moreover, it is possible to realize an amplifier circuit, a test apparatus, and so on using this buffer circuit.

What is claimed is:

1. A buffer circuit that outputs a signal according to an input signal, comprising:
    a first receiving transistor that receives the input signal through its base terminal:
    a first clamp transistor having polarity the same as that of the first receiving transistor, of which an emitter terminal and a collector terminal are connected to corresponding terminals of the first receiving transistor and which receives a first clamp voltage restricting a signal level output from the buffer circuit through its base terminal: and
    a first current defining section that is commonly provided for the first receiving transistor and the first clamp transistor and defines a total amount of emitter currents flowing into the first receiving transistor and the first clamp transistor, wherein
    the buffer circuit outputs an output signal according to an emitter voltage of the first receiving transistor, the buffer circuit further comprising:
    a first output transistor having polarity different from that of the first receiving transistor and the first clamp transistor, of which a base terminal is connected to the emitter terminal of the first transistor and the emitter terminal of the first clamp transistor and which outputs the output signal according to a receiving signal through its base terminal, wherein
    the first receiving transistor outputs, when a signal level of the input signal is within a range defined by the first clamp voltage, a signal having a signal level according to the input signal,
    the first clamp transistor outputs, when the signal level of the input signal is out of a range defined by the first clamp voltage, a signal having a signal level according to the first clamp voltage,
    the first receiving transistor generates a signal having a signal level obtained by adding or subtracting a voltage between the base and the emitter to or from the signal level of the input signal through its emitter terminal,
    the first clamp transistor generates a signal having a signal level obtained by adding or subtracting a voltage between the base and the emitter to or from the first clamp voltage through its emitter terminal, and
    the first output transistor outputs an output signal having a signal level obtained by subtracting or adding a voltage between the base and the emitter from or to a signal level of the signal received through its base terminal, the buffer circuit further comprising:
    a second receiving transistor having polarity different from that of the first receiving transistor, which is provided in parallel with the first receiving transistor and receives the input signal through its base terminal;
    a second clamp transistor having polarity the same as that of the second receiving transistor, of which an emitter terminal and a collector terminal are connected to corresponding terminals of the second receiving transistor and which receives a second clamp voltage smaller than the first clamp voltage through its base terminal;
    a second current defining section that is commonly provided for the second receiving transistor and the second clamp transistor and defines a total amount of emitter currents flowing into the second receiving transistor and the second clamp transistor;
    a second output transistor having polarity different from that of the second receiving transistor and the second clamp transistor, of which a base terminal is connected to an emitter terminal of the second transistor and an emitter terminal of the second clamp transistor and which outputs the output signal according to a receiving signal through its base terminal;

a first operation bias resistor that is provided between the emitter terminal of the first output transistor and the base terminal of the second clamp transistor; and a second operation bias resistor that is provided between the emitter terminal of the second output transistor and the base terminal of the first clamp transistor.

2. The buffer circuit as claimed in claim 1, wherein the voltage between the base and the emitter of the first receiving transistor, the first clamp transistor, and the first output transistor is substantially equal.

3. The buffer circuit as claimed in claim 1, wherein the first receiving transistor outputs, when the signal level of the input signal is not more than the first clamp voltage, a signal having a signal level obtained by adding the voltage between the base and the emitter to the signal level of the input signal, the first clamp transistor outputs, when the signal level of the input signal is larger than the first clamp voltage, a signal having a signal level obtained by adding the voltage between the base and the emitter to the first clamp voltage, the first output transistor outputs a signal having a signal level obtained by subtracting the voltage between the base and the emitter from the signal level of the signal received through its base terminal, the second receiving transistor outputs, when the signal level of the input signal is not less than the second clamp voltage, a signal having a signal level obtained by subtracting a voltage between the base and the emitter from the signal level of the input signal, the second clamp transistor outputs, when the signal level of the input signal is smaller than the second clamp voltage, a signal having a signal level obtained by subtracting a voltage between the base and the emitter from the second clamp voltage, and the second output transistor outputs a signal having a signal level obtained by adding a voltage between the base and the emitter to a signal level of the signal received through its base terminal.

4. The buffer circuit as claimed in claim 1, wherein the emitter terminal of the first output transistor and the emitter terminal of the second output transistor are connected to each other, and the buffer circuit outputs a signal at this connecting point.

5. The buffer circuit as claimed in claim 4, further comprising an output buffer that receives a signal at a connecting point between the first output transistor and the second output transistor and outputs a signal according to this signal.

6. An amplifier circuit that amplifies an input signal and outputs the amplified signal, comprising:

the buffer circuit as claimed in claim 1, wherein the buffer circuit restricts a signal level of the input signal in accordance with a given clamp voltage; and an amplifier that amplifies a signal output from the buffer circuit and outputs the amplified signal 7. A test apparatus that tests a device under test, comprising:

the amplifier circuit as claimed in claim 6, wherein the amplifier circuit amplifies a signal output from the device under test;

a measuring section that measures a signal output from the amplifier circuit; and a deciding section that decides pass/fail of the device under test on the basis of a measurement result measured by the measuring section.

8. The buffer circuit as claimed in claim 1, further comprising a first diode that is provided between the base terminal of the first receiving transistor and the base terminal of the first clamp transistor.

9. The buffer circuit as claimed in claim 8, further comprising a receiving-side resistor that is provided between a terminal receiving the input signal and the base terminal of the first receiving transistor.

10. The buffer circuit as claimed in claim 9, further comprising a second diode having polarity different from that of the first diode, which is provided in parallel with the first diode between the base terminal of the first receiving transistor and the base terminal of the first clamp transistor.

11. The buffer circuit as claimed in claim 10, further comprising a clamp-side resistor that is provided between a terminal receiving the first clamp voltage and a base terminal of the first clamp diode.

12. A buffer circuit that outputs a signal according to an input signal, comprising:

a first receiving transistor that receives the input signal through its base terminal;

a first clamp transistor having polarity the same as that of the first receiving transistor, of which an emitter terminal and a collector terminal are connected to corresponding terminals of the first receiving transistor and which receives a first clamp voltage restricting a signal level output from the buffer circuit through its base terminal; and a first current defining section that is commonly provided for the first receiving transistor and the first clamp transistor and defines a total amount of emitter currents flowing into the first receiving transistor and the first clamp transistor, wherein the buffer circuit outputs an output signal according to an emitter voltage of the first receiving transistor, the buffer circuit further comprising:

a first output transistor having polarity different from that of the first receiving transistor and the first clamp transistor, of which a base terminal is connected to the emitter terminal of the first transistor and the emitter terminal of the first clamp transistor and which outputs the output signal according to a receiving signal through its base terminal, wherein the first receiving transistor outputs, when a signal level of the input signal is within a range defined by the first clamp voltage, a signal having a signal level according to the input signal, the first clamp transistor outputs, when the signal level of the input signal is out of a range defined by the first clamp voltage, a signal having a signal level according to the first clamp voltage, the first receiving transistor generates a signal having a signal level obtained by adding or subtracting a voltage between the base and the emitter to or from the signal level of the input signal through its emitter terminal, the first clamp transistor generates a signal having a signal level obtained by adding or subtracting a voltage between the base and the emitter to or from the first clamp voltage through its emitter terminal, and the first output transistor outputs an output signal having a signal level obtained by subtracting or adding a voltage between the base and the emitter from or to a signal level of the signal received through its base terminal, the buffer circuit further comprising:

a second receiving transistor having polarity different from that of the first receiving transistor, which is provided in parallel with the first receiving transistor and receives the input signal through its base terminal;

a second clamp transistor having polarity the same as that of the second receiving transistor, of which an emitter terminal and a collector terminal are connected to corresponding terminals of the second receiving transistor and which receives a second clamp voltage smaller than the first clamp voltage through its base terminal;

a second current defining section that is commonly provided for the second receiving transistor and the second clamp transistor and defines a total amount of emitter currents flowing into the second receiving transistor and the second clamp transistor;

a second output transistor having polarity different from that of the second receiving transistor and the second clamp transistor, of which a base terminal is connected to an emitter terminal of the second transistor and an emitter terminal of the second clamp transistor and which outputs the output signal according to a receiving signal through its base terminal; and a common operation bias resistor that connects the emitter terminal of the first output transistor and the emitter terminal of the second output transistor to an electric potential between the first clamp voltage and the second clamp voltage.

13. The buffer circuit as claimed in claim 12, wherein the voltage between the base and the emitter of the first receiving transistor, the first clamp transistor, and the first output transistor is substantially equal.

14. The buffer circuit as claimed in claim 12, wherein
the first receiving transistor outputs, when the signal level of the input signal is not more than the first clamp voltage, a signal having a signal level obtained by adding the voltage between the base and the emitter to the signal level of the input signal,
the first clamp transistor outputs, when the signal level of the input signal is larger than the first clamp voltage, a signal having a signal level obtained by adding the voltage between the base and the emitter to the first clamp voltage,
the first output transistor outputs a signal having a signal level obtained by subtracting the voltage between the base and the emitter from the signal level of the signal received through its base terminal,
the second receiving transistor outputs, when the signal level of the input signal is not less than the second clamp voltage, a signal having a signal level obtained by subtracting a voltage between the base and the emitter from the signal level of the input signal,
the second clamp transistor outputs, when the signal level of the input signal is smaller than the second clamp voltage, a signal having a signal level obtained by subtracting a voltage between the base and the emitter from the second clamp voltage, and
the second output transistor outputs a signal having a signal level obtained by adding a voltage between the base and the emitter to a signal level of the signal received through its base terminal.

15. The buffer circuit as claimed in claim 12, wherein
the emitter terminal of the first output transistor and the emitter terminal of the second output transistor are connected to each other, and
the buffer circuit outputs a signal at this connecting point.

16. The buffer circuit as claimed in claim 15, further comprising an output buffer that receives a signal at a connecting point between the first output transistor and the second output transistor and outputs a signal according to this signal.

17. The buffer circuit as claimed in claim 12, further comprising a first diode that is provided between the base terminal of the first receiving transistor and the base terminal of the first clamp transistor.

18. The buffer circuit as claimed in claim 17, further comprising a receiving-side resistor that is provided between a terminal receiving the input signal and the base terminal of the first receiving transistor.

19. The buffer circuit as claimed in claim 18, further comprising a second diode having polarity different from that of the first diode, which is provided in parallel with the first diode between the base terminal of the first receiving transistor and the base terminal of the first clamp transistor.

20. The buffer circuit as claimed in claim 19, further comprising a clamp-side resistor that is provided between a terminal receiving the first clamp voltage and a base terminal of the first clamp diode.

21. An amplifier circuit that amplifies an input signal and outputs the amplified signal, comprising:
the buffer circuit as claimed in claim 12, wherein the buffer circuit further restricts a signal level of the input signal in accordance with a given clamp voltage; and
an amplifier that amplifies a signal output from the buffer circuit and outputs the amplified signal.

22. A test apparatus that tests a device under test, comprising:
the amplifier circuit as claimed in claim 21, wherein the amplifier circuit further amplifies a signal output from the device under test;
a measuring section that measures a signal output from the amplifier circuit; and
a deciding section that decides pass/fail of the device under test on the basis of a measurement result measured by the measuring section.

23. A buffer circuit that outputs a signal according to an input signal, comprising:
a first receiving transistor that receives the input signal through its base terminal;
a first clamp transistor having polarity the same as that of the first receiving transistor, of which an emitter terminal and a collector terminal are connected to corresponding terminals of the first receiving transistor and which receives a first clamp voltage restricting a signal level output from the buffer circuit through its base terminal; and
a first current defining section that is commonly provided for the first receiving transistor and the first clamp transistor and defines a total amount of emitter currents flowing into the first receiving transistor and the first clamp transistor, wherein
the buffer circuit outputs an output signal according to an emitter voltage of the first receiving transistor, the buffer circuit further comprising:
a first output transistor having polarity different from that of the first receiving transistor and the first clamp transistor, of which a base terminal is connected to the emitter terminal of the first transistor and the emitter terminal of the first clamp transistor and which outputs the output signal according to a receiving signal through its base terminal; and
a first diode that is provided between the base terminal of the first receiving transistor and the base terminal of the first clamp transistor.

24. The buffer circuit as claimed in claim 23, further comprising a receiving-side resistor that is provided between a terminal receiving the input signal and the base terminal of the first receiving transistor.

25. The buffer circuit as claimed in claim 24, further comprising a second diode having polarity different from that of the first diode, which is provided in parallel with the first diode between the base terminal of the first receiving transistor and the base terminal of the first clamp transistor.

26. The buffer circuit as claimed in claim 25, further comprising a clamp-side resistor that is provided between a terminal receiving the first clamp voltage and a base terminal of the first clamp diode.

27. An amplifier circuit that amplifies an input signal and outputs the amplified signal, comprising:
the buffer circuit as claimed in claim 23, wherein the buffer circuit further restricts a signal level of the input signal in accordance with a given clamp voltage; and
an amplifier that amplifies a signal output from the buffer circuit and outputs the amplified signal.

28. A test apparatus that tests a device under test, comprising:
the amplifier circuit as claimed in claim 27, wherein the amplifier circuit further amplifies a signal output from the device under test;
a measuring section that measures a signal output from the amplifier circuit; and
a deciding section that decides pass/fail of the device under test on the basis of a measurement result measured by the measuring section.

* * * * *